(12) United States Patent
Hammond et al.

(10) Patent No.: US 11,201,451 B2
(45) Date of Patent: Dec. 14, 2021

(54) POROUS DISTRIBUTED BRAGG REFLECTORS FOR LASER APPLICATIONS

(71) Applicant: IQE plc, Cardiff (GB)

(72) Inventors: Rich Hammond, Gwent (GB); Rodney Pelzel, Emmaus, PA (US); Drew Nelson, Vale of Glamorgan (GB); Andrew Clark, Mountain View, CA (US); David Cheskis, Belle Mead, NJ (US); Michael Lebby, San Francisco, CA (US)

(73) Assignee: IQE plc, Cardiff (GB)

( * ) Notice: Subject to any disclaimer, the term of this patent is extended or adjusted under 35 U.S.C. 154(b) by 86 days.

(21) Appl. No.: 16/252,334

(22) Filed: Jan. 18, 2019

(65) Prior Publication Data
US 2019/0221993 A1    Jul. 18, 2019

Related U.S. Application Data

(60) Provisional application No. 62/618,985, filed on Jan. 18, 2018.

(51) Int. Cl.
*H01S 5/00* (2006.01)
*H01S 5/02* (2006.01)
(Continued)

(52) U.S. Cl.
CPC ............ *H01S 5/0206* (2013.01); *H01L 33/10* (2013.01); *H01L 33/105* (2013.01);
(Continued)

(58) Field of Classification Search
CPC ........ H01S 5/18361–1838; H01S 5/18–18397; H01L 33/10; H01L 33/105; G02B 5/0816–085
See application file for complete search history.

(56) References Cited

U.S. PATENT DOCUMENTS

| | | | | |
|---|---|---|---|---|
| 5,306,385 A | * | 4/1994 | Cho ...................... | H01S 3/0627 117/2 |
| 5,939,732 A | * | 8/1999 | Kurtz .................... | H01L 33/105 257/77 |

(Continued)

FOREIGN PATENT DOCUMENTS

| | | |
|---|---|---|
| EP | 1 722 265 | 11/2006 |
| GB | 2 347 559 | 9/2000 |

(Continued)

OTHER PUBLICATIONS

Pavesi et al. "All-porous silicon-coupled microcavities: Experiment versus theory" Physical Review B, vol. 58, No. 23, Dec. 15, 1998 (Year: 1998).*

(Continued)

*Primary Examiner* — Xinning(Tom) Niu
*Assistant Examiner* — Delma R Fordé
(74) *Attorney, Agent, or Firm* — Sterne, Kessler, Goldstein & Fox P.L.L.C.

(57) ABSTRACT

Embodiments described herein provide a layered structure that comprises a substrate that includes a first porous multilayer of a first porosity, an active quantum well capping layer epitaxially grown over the first porous multilayer, and a second porous multilayer of the first porosity over the active quantum well capping layer, where the second porous multilayer aligns with the first porous multilayer.

21 Claims, 11 Drawing Sheets

(51) Int. Cl.
*H01S 5/183* (2006.01)
*H01S 5/42* (2006.01)
*H01S 5/10* (2021.01)
*H01S 5/026* (2006.01)
*H01S 5/40* (2006.01)
*H01L 33/10* (2010.01)
*H01S 5/34* (2006.01)
*G02B 5/08* (2006.01)

(52) U.S. Cl.
CPC .......... *H01S 5/0261* (2013.01); *H01S 5/1071* (2013.01); *H01S 5/18361* (2013.01); *H01S 5/4087* (2013.01); *H01S 5/423* (2013.01); *G02B 5/0816* (2013.01); *H01S 5/18319* (2013.01); *H01S 5/34* (2013.01)

(56) References Cited

U.S. PATENT DOCUMENTS

| | | | | |
|---|---|---|---|---|
| 6,376,269 | B1* | 4/2002 | Chen | H01S 5/18341 372/50.11 |
| 6,549,556 | B1* | 4/2003 | Hwang | H01S 5/18341 372/96 |
| 2002/0044585 | A1 | 4/2002 | Song et al. | |
| 2002/0163688 | A1* | 11/2002 | Zhu | H04B 10/2581 398/144 |
| 2002/0179930 | A1* | 12/2002 | Irwin | G01R 31/311 257/190 |
| 2003/0081642 | A1* | 5/2003 | Hwang | H01S 5/18341 372/45.01 |
| 2004/0076209 | A1* | 4/2004 | Bour | B82Y 20/00 372/45.01 |
| 2004/0233963 | A1* | 11/2004 | Hooper | B82Y 20/00 372/99 |
| 2005/0121678 | A1* | 6/2005 | Ezaki | H01S 5/18355 257/79 |
| 2006/0187997 | A1* | 8/2006 | Ezaki | H01S 5/3201 372/99 |
| 2007/0013991 | A1* | 1/2007 | Kise | G02B 6/1225 359/245 |
| 2008/0112442 | A1 | 5/2008 | Ikuta | |
| 2009/0180509 | A1 | 7/2009 | Kise et al. | |
| 2013/0034117 | A1* | 2/2013 | Hibbs-Brenner | H01S 5/34326 372/45.01 |
| 2014/0003458 | A1* | 1/2014 | Han | H01L 21/306 372/45.01 |
| 2015/0131691 | A1* | 5/2015 | Lee | H01S 5/18377 372/50.11 |
| 2015/0303655 | A1* | 10/2015 | Han | H01S 5/34333 372/45.012 |
| 2016/0153113 | A1 | 6/2016 | Zhang et al. | |
| 2017/0093128 | A1* | 3/2017 | Fattal | H01S 5/18386 |
| 2017/0237234 | A1* | 8/2017 | Han | H01S 5/187 372/45.012 |
| 2019/0172923 | A1* | 6/2019 | Pelzel | H01L 21/02123 |
| 2020/0119521 | A1* | 4/2020 | Feng | H01S 5/125 |

FOREIGN PATENT DOCUMENTS

| | | | | |
|---|---|---|---|---|
| WO | WO-2016054232 | A1* | 4/2016 | ....... H01L 21/30635 |
| WO | WO-2018184288 | A1* | 10/2018 | ......... H01S 5/18305 |

OTHER PUBLICATIONS

D. Feezell, et al. "InP-Based 1.3-1.6μm VCSELs with selectively etched tunnel-junction apertures on a wavelength flexible platform" IEEE Photonics Technology Letters, vol. 17, No. 10, Oct. 2005, pp. 2017-2019. (Year: 2005).*

Twesten et al., "Microstructure of laterally oxidized $Al_xGa_{1-x}As$ layers in vertical-cavity lasers," *Applied Physics Letters*, vol. 69, No. 1, Jul. 1, 1996, pp. 19-21.

* cited by examiner

POROUS DISTRIBUTED BRAGG REFLECTORS FOR LASER APPLICATIONS

CROSS-REFERENCE TO RELATED APPLICATIONS

This application claims priority benefit under 35 U.S.C. § 119(e) from U.S. provisional application No. 62/618,985, filed on Jan. 18, 2018. The aforementioned, earlier-filed application is hereby incorporate by reference herein in its entirety.

FIELD OF USE

This application relates to forming a distributed Bragg reflector (DBR) on a base substrate in a semiconductor device.

BACKGROUND

Conventional vertical-cavity surface-emitting lasers (VCSELs) utilize a III-V multilayer (e.g. $Al_xGa_{1-x}As/Al_yGa_{1-y}As$, $0 \leq x, y \leq 1$, which is GaAs/AlAs when $x=0$, $y=1$) to act as the DBR to pass through laser lights due to the periodically varying refractive index of the layers.

However, the epitaxial GaAs DBRs are often expensive to produce, and can induce unwanted strain effects in the final epitaxial stack because they require a large total of epitaxial layers. The induced defects may limit device lifetimes and result in device yield loss. Additionally, conventional epitaxial DBRs are usually limited to allowing the same wavelength(s) to pass through across the entire substrate.

SUMMARY

Embodiments described herein provide a layered structure that comprises a substrate that includes a first porous multilayer of a first porosity, an active quantum well capping layer epitaxially grown over the first porous multilayer, and a second porous multilayer of the first porosity over the active quantum well capping layer, where the second porous multilayer aligns with the first porous multilayer.

In one embodiment, the substrate is composed of germanium or gallium arsenide.

In one embodiment, a stack of the first porous multilayer, at least a first part of the active quantum well capping layer that aligns with the first porous multilayer, and the second porous multilayer allows a first light wave at a first wavelength to pass through the stack.

In one instance, the layered structure further comprises a first epitaxial distributed Bragg reflector multilayer grown over the substrate between the first porous multilayer and the active quantum well capping layer. In this instance, the first reflectivity of the first epitaxial distributed Bragg reflector multilayer is different from a second reflectivity of the second epitaxial distributed Bragg reflector multilayer. In this way, the first porous multilayer, the first epitaxial distributed Bragg reflector multilayer, and the second epitaxial distributed Bragg reflector multilayer allow a first light wave at a first wavelength to pass through the stack.

In one embodiment, the first porous multilayer and the second porous multilayer of the layered structure further aligns with a first region on the active quantum well capping layer, and the substrate includes a third porous multilayer. In this embodiment, the layered structure further comprises a fourth porous multilayer having the second porosity over the active quantum well capping layer, the second porous multilayer and the fourth porous multilayer are porous portions of a bulk layer grown over the active quantum well capping layer, and the third porous multilayer and the fourth porous multilayer aligns with a second region on the active quantum well capping layer.

Further in this embodiment, the first porous multilayer and the third porous multilayer may have different dimensions or different porosities. The second porous multilayer and the fourth porous multilayer may also have different dimensions or different porosities.

Further yet in this embodiment, the first porous multilayer, at least the first region of the active quantum well capping layer, and the second porous multilayer form a first VCSEL that allows a first light wave at a first wavelength to pass through. Additionally, the third porous multilayer, at least the second region of the active quantum well capping layer, and the fourth porous multilayer may form a second VCSEL that allows a second light wave at a second wavelength to pass through.

Further yet in this embodiment, the layered structure may further comprise a pseudomorphic high-electron-mobility transistor or a heterojunction bipolar transistor integrated into the bulk wafer at a space between the second porous multilayer and the fourth porous multilayer.

Further yet in this embodiment, the second porous multilayer and the fourth porous multilayer may have the same porosity and may be connected to each other as a continuous, porous multilayer in the bulk wafer.

In the embodiment above where the second porous multilayer and the fourth porous multilayer have the same porosity and are connected to each other, the layered structure may further comprise a pin diode integrated into the substrate at a space between the first porous multilayer and the third porous multilayer.

In the embodiment above where the layered structure further comprises a pin diode, the continuous porous multilayer may include a fifth porous multilayer aligning with the pin diode, and the fifth porous multilayer may have a third porosity that allows the fifth porous multilayer to reflect the first light wave at the first wavelength emitted from the active quantum well capping layer to a direction of the pin diode.

In the embodiment above where the layered structure further comprises a fifth porous multilayer, the layered structure may further include a sixth porous multilayer in proximity to the pin diode. The sixth porous multilayer may be configured to allow the first light wave at the first wavelength to pass through to reach the pin diode.

Further in this embodiment, the thickness and porosity of at least one vertical porous multilayer may be selected to form a porous filter that allows a third light wave at a third wavelength to pass between two adjacent VCSELs from the multiple VCSELs.

Further yet in this embodiment, the thickness and porosity of at least one vertical porous multilayer is selected to form a porous isolation that allows no light wave passage between two adjacent VCSELs from multiple VCSELs.

In one instance, the second porous multilayer of the layered structure is a porous portion of a bulk layer grown over the active quantum well capping layer. In this instance, the bulk layer may have a plurality of spatially distributed porous multilayers, where each porous multilayer from the plurality has a porosity selected to yield a specific reflectivity of the respective porous multilayer to allow a light wave at a specific wavelength to pass through.

In one embodiment, the layered structure further comprises one or more vertical porous multilayers perpendicular to and across the first porous multilayer, the active quantum well capping layer and the second porous multilayer. In this embodiment, the one or more porous multilayers may divide a stack of the first porous multilayer, the active quantum well capping layer and the second porous multilayer to form multiple VCSELs.

In another embodiment, a layered structure comprises a substrate, a first epitaxial distributed Bragg reflector multilayer grown over the substrate, an active quantum well capping layer epitaxially grown over the first epitaxial distributed Bragg reflector multilayer, and a porous multilayer composed of a same material with the substrate. The porous multilayer may be over the active quantum well capping layer.

In one embodiment, the layered structure above comprising the first epitaxial distributed Bragg reflector multilayer comprises a second epitaxial distributed Bragg reflector multilayer grown over the active quantum well and between the active quantum well and the porous multilayer. In this embodiment, a first reflectivity of the first epitaxial distributed Bragg reflector multilayer is different from a second reflectivity of the second epitaxial distributed Bragg reflector multilayer. In this way, a stack of the porous multilayer, the first epitaxial distributed Bragg reflector multilayer, and the second epitaxial distributed Bragg reflector multilayer is allowed a first light wave at a first wavelength to pass through the stack.

In another embodiment, a circular layered structure comprises a circular substrate, a first radial porous distributed Bragg reflector multilayer radially beneath the circular substrate, a circular active quantum well capping layer radially beneath the first radial porous distributed Bragg reflector multilayer, and a second radial porous distributed Bragg reflector multilayer radially beneath the circular active quantum well capping layer.

In one embodiment of the circular layered structure, the first radial porous distributed Bragg reflector multilayer has a same radial porosity with the second radial porous distributed Bragg reflector multilayer.

In one embodiment of the circular layered structure, the first radial porous distributed Bragg reflector multilayer, the circular active quantum well capping layer and the second radial porous distributed Bragg reflector multilayer form a focused VSCEL that allows a first light wave at a first wavelength to pass through.

BRIEF DESCRIPTION OF DRAWINGS

Further features of the disclosure, its nature and various advantages will be apparent upon consideration of the following detailed description, taken in conjunction with the accompanying drawings, in which.

DETAILED DESCRIPTION

Structures and methods described herein provide a DBR formed by a porous structure to a substrate. For example, the structure described herein grows a porous germanium (Ge), gallium arsenide (GaAs), or indium phosphide (InP) multilayer within a base Ge, GaAs or InP substrate, respectively, to form a DBR. Traditionally, an epitaxial DBR usually yields a thick epitaxial stack because the epitaxial DBRs require a large total of epitaxial layers. By using a porous multilayer to form a DBR on a substrate, the thickness of the final epitaxial stack can be significantly reduced compared to the large total of epitaxial DBR layers that induce strain in the substrate. Specifically, porous structures can be selectively grown as different spatially separated portions with different porosity within the same substrate. In this way, the different portions of the porous structures can form different spatially separated DBRs on the same substrate and thus can allow different wavelengths of laser lights to pass through.

It is worth noting that FIGS. 1-9 show a Ge or GaAs substrate for illustrative purpose only. The structures containing porous layers described in FIGS. 1-7 can be applied to an epitaxial substrate such as, a III-V semiconductor (e.g. $Al_xGa_{1-x}As/Al_yGa_{1-y}As$, $0 \le x, y \le 1$, which is GaAs/AlAs when $x=0$, $y=1$, $In_xGa_{1-x}As$ $0 \le x \le 1$) and/or the like.

Figure 1:
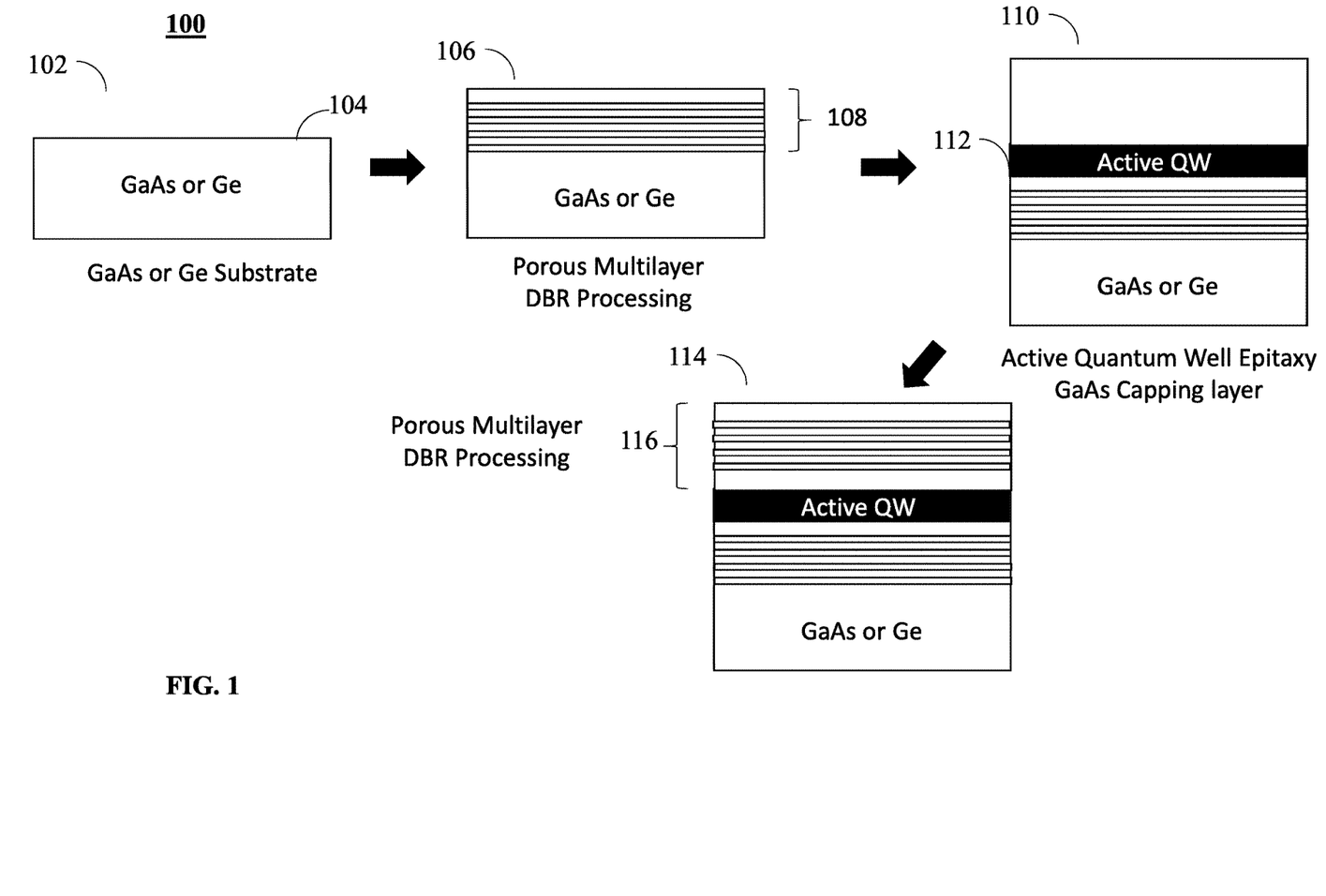
FIG. 1 shows an example diagram illustrating a process to grow layered structure with porous multilayer processing for a DBR, according to an illustrative embodiment.

FIG. 1 shows an example diagram illustrating a process to grow a layered structure with porous multilayer processing for a DBR, according to an illustrative embodiment. Process 100 starts at 102 by selecting a substrate 104. At 106, a portion of substrate is modified as a porous portion 108 a first porosity within the substrate 104. For example, the porous portion 108 is generated by exposing an area of substrate 104 to an acid current such that the area of the substrate 104 is etched to form the porous portion 108. The first porosity may be configured by controlling the concentration and/or the fluid velocity of the acid current. At 110, one or more epitaxial layers 112 are epitaxially grown over the porous multilayer 108, where the epitaxial layers 112 can confine an active quantum well cap. At 114, another porous multilayer 116 having the same porosity with the porous multilayer 108 is created over the supporting layers 112. The second porous multilayer 116 is aligned with the porous multilayer 108 to create a VCSEL.

Figure 4:
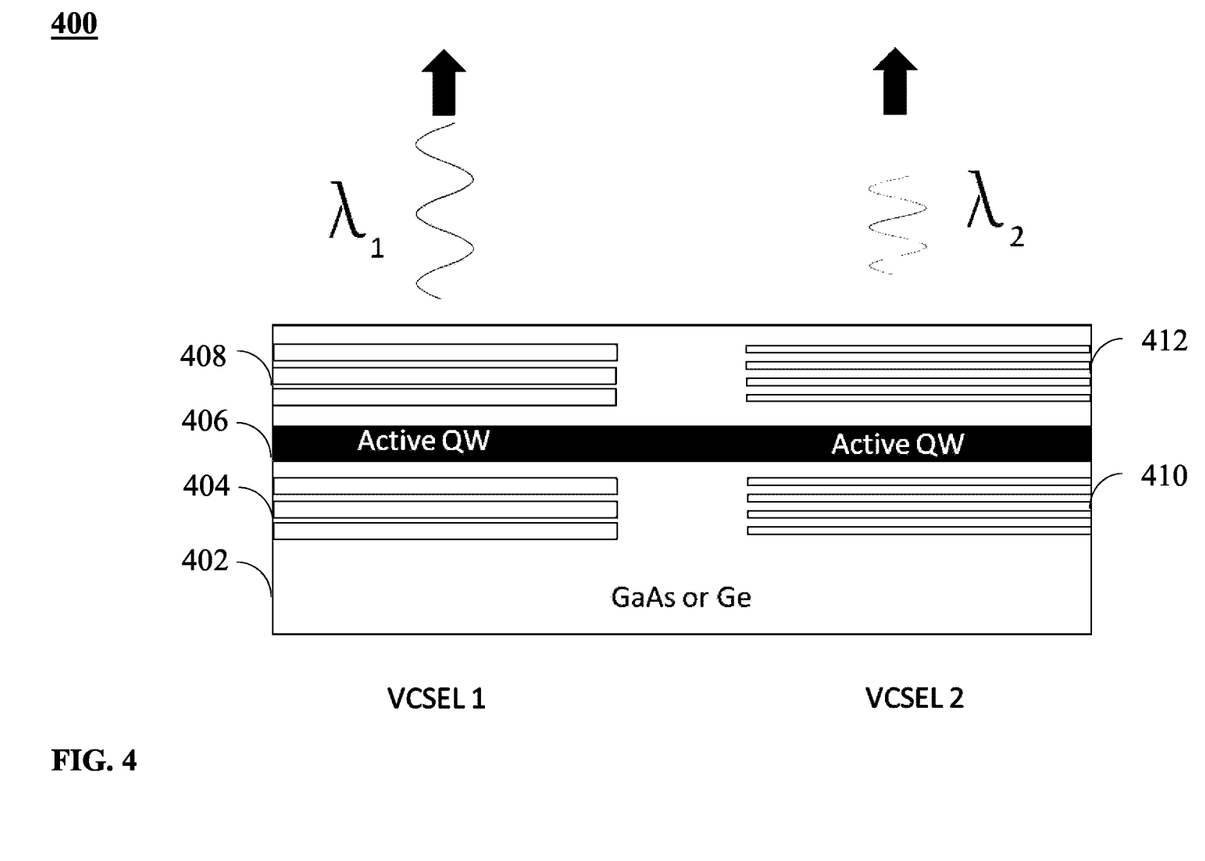
FIG. 4 shows an example diagram illustrating a layered structure including two spatially separated VCSELs on a single substrate, according to an illustrative embodiment.

This process 100 described in FIG. 1 may be repeated at different spatially separated portions of substrate 104 to form different DBR stacks with different porosities at different regions on the same substrate 104, as shown in FIG. 4. The different porosities allow the substrate to function as a wavelength mirror for multiple wavelengths at the same time. The formed different DBR stacks/VCSELs also allow for integration of different devices on a single substrate 104 between the spatially separated DBRs, as further shown in FIGS. 6-7.

Figure 2:
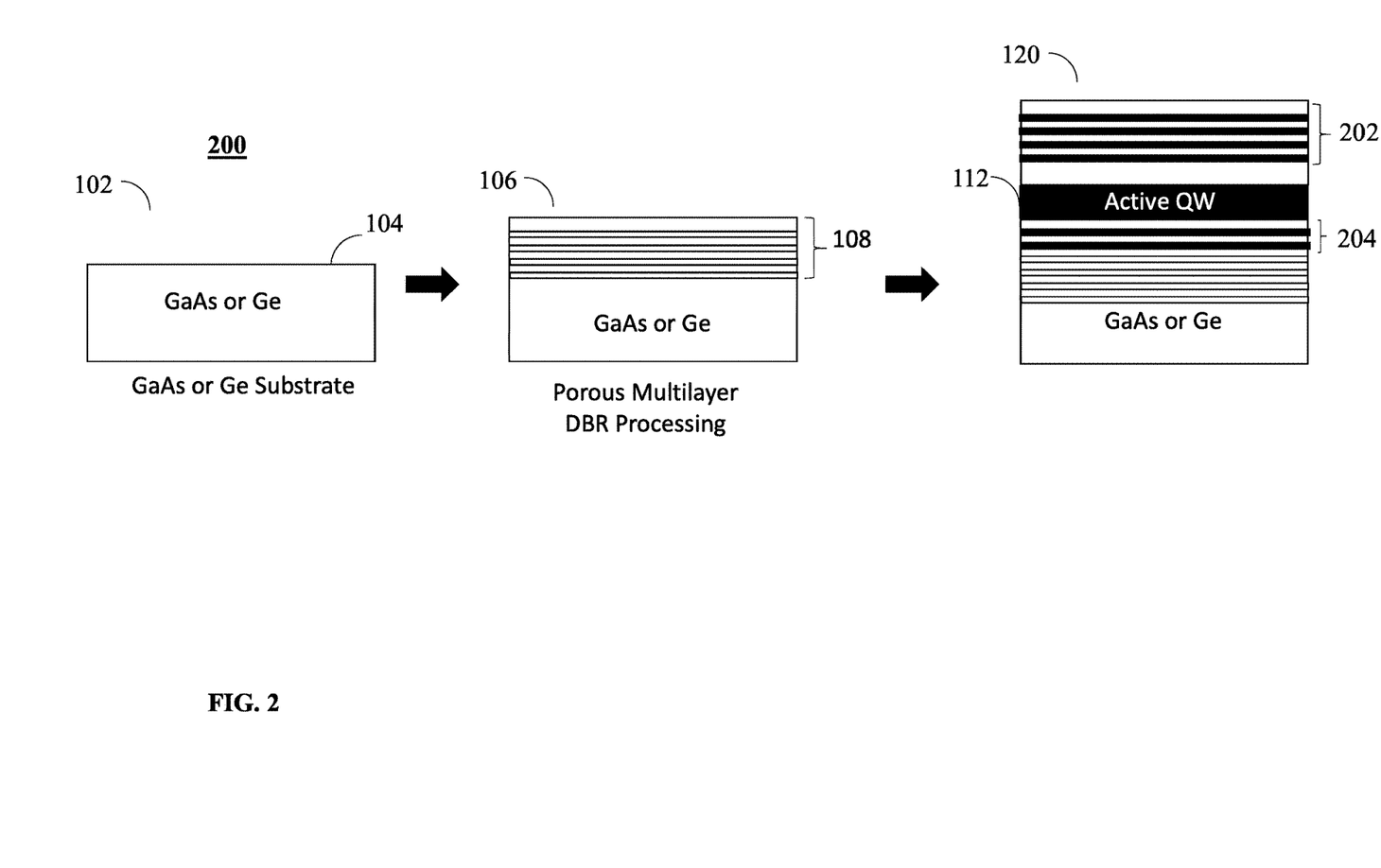
FIG. 2 shows an example diagram illustrating a process to grow layered structure with an epitaxial layer over a porous multilayer processing for a DBR, according to an illustrative embodiment.

FIG. 2 shows an example diagram illustrating a process to grow layered structure with an epitaxial DBR layer over a porous multilayer processing for a DBR, according to an illustrative embodiment. The process 200 in FIG. 2 can be similar to process 100 in FIG. 1 up to 106 where the substrate has a porous multilayer 108 in a portion of the substrate 104. At 120, a first epitaxial DBR 204 is grown over the porous multilayer 108, an active quantum well cap and surrounding layers needed for quantum layer 112 are epitaxially grown over the first epitaxial DBR 204, and a second epitaxial multilayer DBR 202 is grown over the active quantum well and surrounding layers 112. In some embodiments, the porous reflectivity of porous multilayer DBR 108 may be combined with the epitaxial reflectivity of the first epitaxial DBR 204 to form a chirped epitaxial mirror to engineer reflectivity. For example, in some embodiments, the porous multilayer 108 and the epitaxial multilayers 204 and 202 of the formed VCSELs operate at the same wavelength and allow a first set of light waves corresponding to a first set of wavelengths to pass through the VCSEL formed at 120 and reflect a second set of light waves of a second set of wavelengths. In some embodiments, the porous multilayer 108 and epitaxial multilayers 204 and 202 of the formed VCSELs may operate at different wavelengths.

Figure 3:
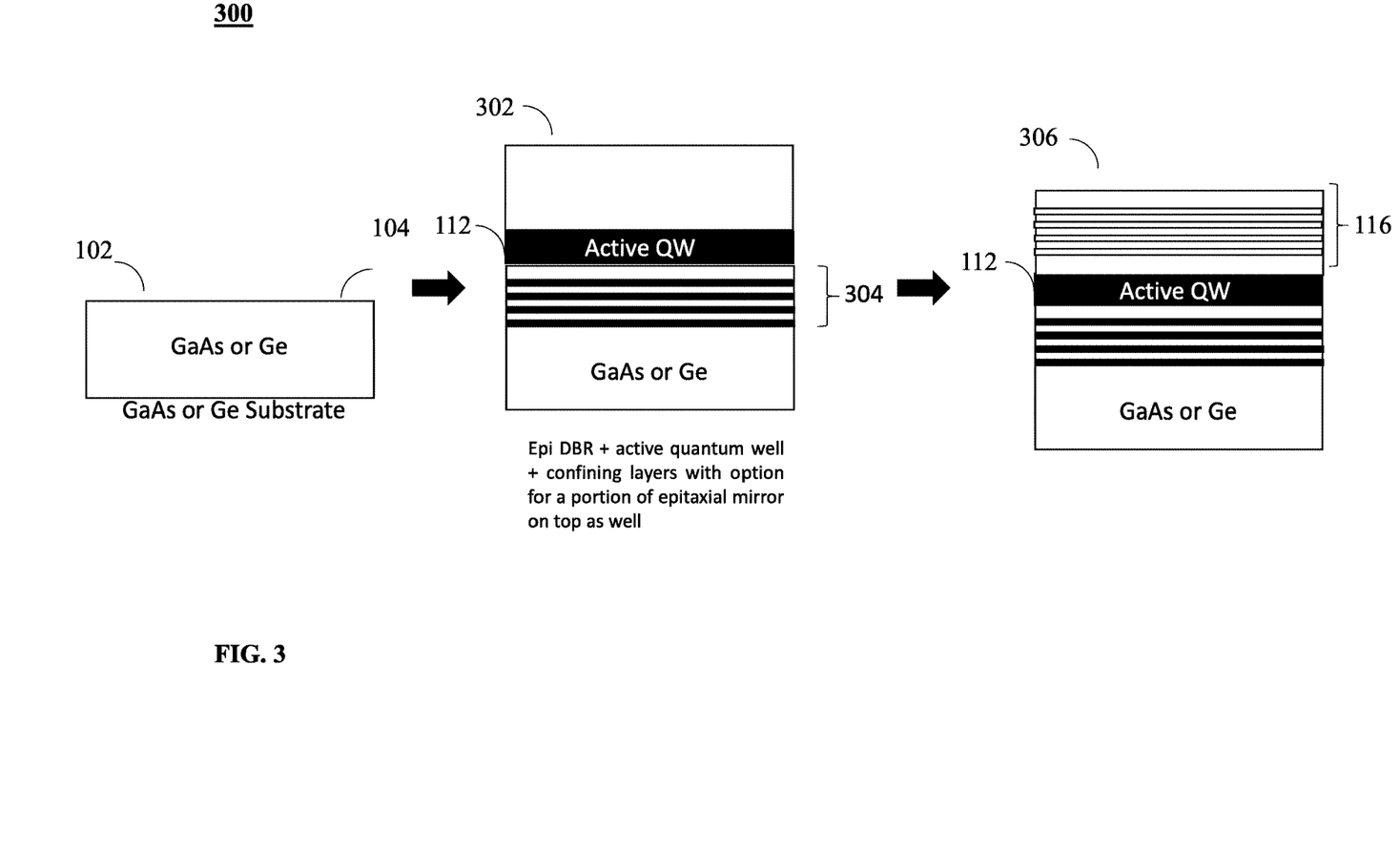
FIG. 3 shows an example diagram illustrating a process to grow layered structure with porous multilayer processing over an epitaxial layer for a DBR, according to an illustrative embodiment.

FIG. 3 shows an example diagram illustrating a process to grow layered structure with porous multilayer processing over an epitaxial layer for a DBR, according to an illustrative embodiment. The process 300 in FIG. 3 starts at 102 with the same substrate 104. At 302 an epitaxial multilayer DBR 304 is grown over substrate 104, the active quantum well cap and surrounding layers needed for quantum layer 112 are epitaxially grown over the epitaxial multilayer DBR 304. At 306, a porous multilayer 116 is formed over the active quantum well supporting layers 112. In some embodiments, after step 302, a second set of epitaxial multilayer DBR may be grown over the active quantum well capping layer 112 to create an epitaxial mirror at the upper portion of the layered structure at 306, which can be similar to the chirped epitaxial mirror formed at step 120 in FIG. 2 but with different compositions of epitaxial DBR or porous DBRs below or above the quantum well cap.

FIG. 4 shows an example diagram illustrating a layered structure 400 according to an illustrative embodiment. The layered structure 400 of FIG. 4 is built on substrate 402. Substrate 402 may be similar to substrate 102 described in FIGS. 1-3. The process 100 described in FIG. 1 can be used to form DBR stacks/VSCELs at different regions of the substrate 402, e.g., different spatially separated portions of porous multilayers having different porosities (e.g., see 404, 410) can be formed on the same substrate 402, followed by a single active quantum well capping layer and confining layers needed for quantum layer 406 that are grown over all different portions of the porous GaAs/Ge multilayers 404 and 410. On top of the active quantum well capping layer 406, additional portions of porous multilayers 408 and 412 are formed. Specifically, the additional portions of porous multilayers 408 and 412 are formed to align with porous portions 404 and 410, respectively, and with the same respective porosity. Consequently, as shown in FIG. 4, multiple VCSELs can be formed on the same substrate 402, e.g., VCSEL 1 and VCSEL 2. It is noted that only two VCSELs are shown in FIG. 4 for illustrative purpose only. Multiple spatially separated VCSELs (more than two) can be formed on the same substrate 402 in a similar way as described above.

VCSEL 1 illustrates a first layered structure on substrate 402 including a first porous GaAs multilayer 404 having a first porosity over the substrate 402, an active quantum well capping layer 406 epitaxially grown over the first porous GaAs multilayer 104, a second porous GaAs multilayer 408, having the same first porosity, over the active quantum well capping layer 406 aligned with the porous GaAs multilayer 404.

VCSEL 2 illustrates a third porous GaAs multilayer 410 having a second porosity over the substrate 102, the active quantum well capping layer 406 epitaxially grown over the third porous GaAs multilayer 410, a fourth porous GaAs multilayer 112, having the same second porosity, over the active quantum well capping layer 106 aligned with the second porous GaAs multilayer 410.

By creating porous multilayers having different first and second porosities on the same substrate 402, VCSELs configured to operate at different wavelengths can be integrated on a single substrate. Thus, the integrated VCSELs on the same substrate can yield a wide optical stopband, and provide multiple wavelength mirrors on the same substrate 402.

Figure 5:
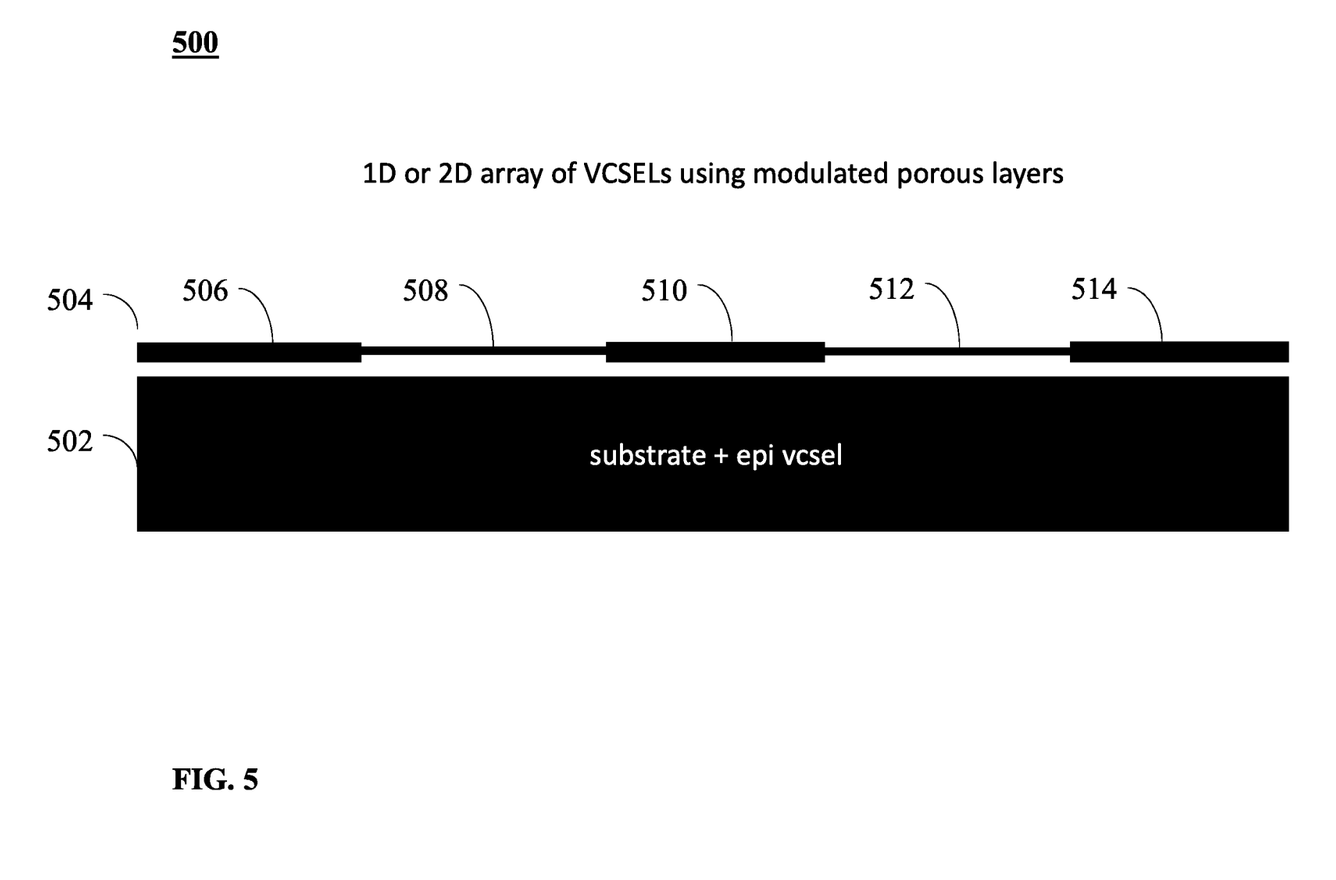
FIG. 5, shows an example diagram illustrating a layered structure including two VCSELs on a single substrate to form a 2-dimensional array, according to an illustrative embodiment.

FIG. 5 shows an embodiment illustrating a layered structure including multiple VCSELs on a single substrate to form a 1-dimensional and/or 2-dimensional array, according to an illustrative embodiment. Layered structure 500 shows a substrate and epitaxial VCSEL 502 where an epitaxial DBR and an active quantum well cap and confining layers are epitaxially grown. Above 502, a single bulk wafer 504 to form porous DBRs is grown, where spatially separated porous DBRs of different porosities can be formed, e.g., at portions 506, 508, 510, 512, and 514. For example, the porous region 506 has a first porosity, the porous region 508 has a second porosity, the porous region 510 has a third porosity, the porous region 512 has a fourth porosity, and the porous region 514 has a fifth porosity. In some embodiments, the process of producing different amount of porosity across a single wafer 504 effectively creates a 1-dimensional or 2-dimensional array. In some embodiments, the epitaxial VCSEL at the substrate 502 may include a DBR with an epitaxial component as described in FIGS. 3-4. In some embodiments, the porous DBRs formed by the porous regions 506, 508, 510, 512, or 514 may form a VCSEL by being phase with the epitaxial DBRs in the substrate 502 and portions that are out of phase to suppress the VCSEL.

Figure 6:
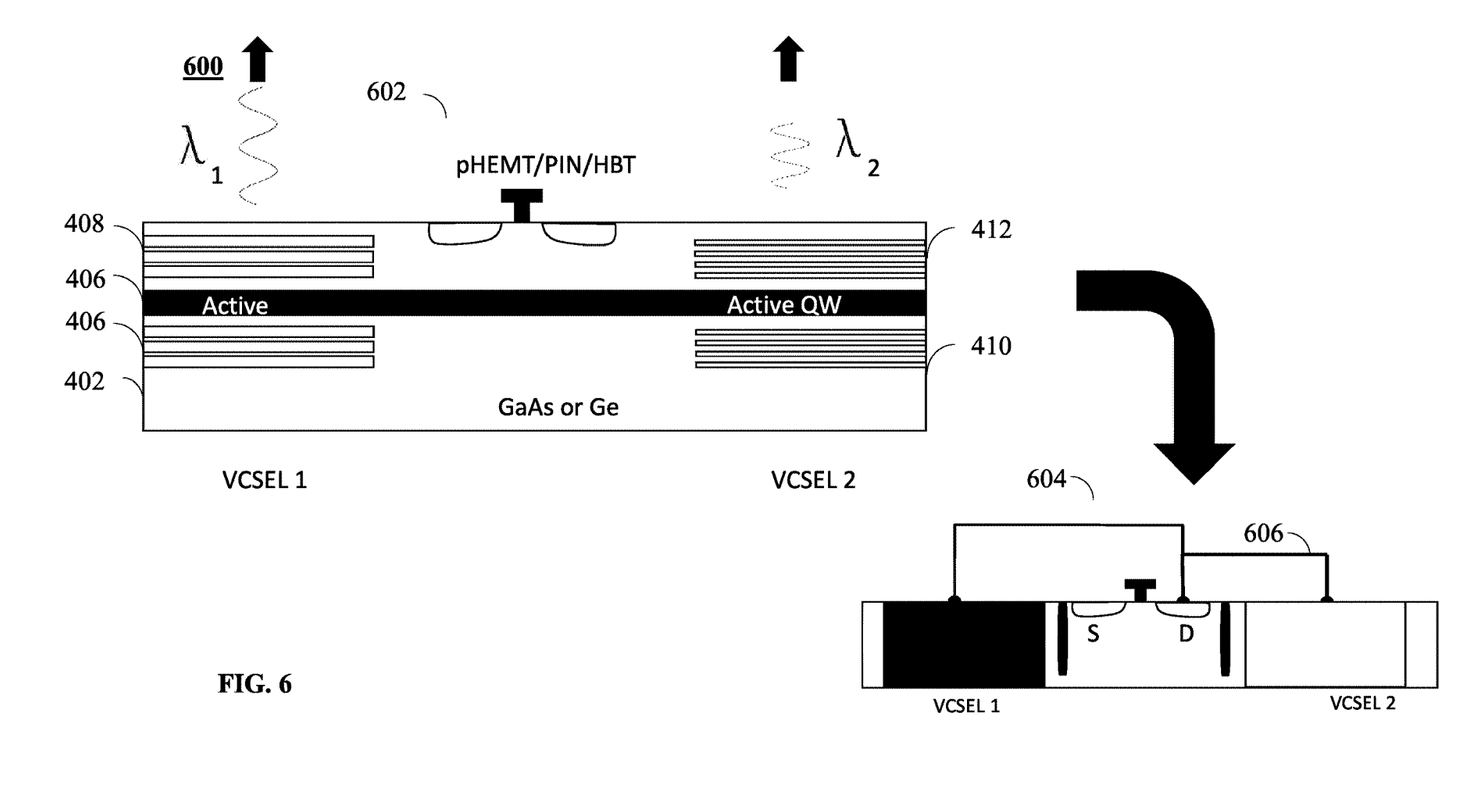
FIG. 6 shows an example diagram illustrating a heterojunction bipolar transistor integrated into a layered structure described in FIG. 2, according to an illustrative embodiment.

FIG. 6 shows an example diagram illustrating an integration of the layered structure 400 described in FIG. 4 with a semiconductor device via a transistor, according to an illustrative embodiment. Layered structure 602 includes two VCSELs VCSEL 1 and VCSEL 2 formed on the same substrate 402, which is similar to the layered structure 400 in FIG. 4. Additionally, FIG. 6 shows a pseudomorphic high-electron-mobility transistor (pHEMT) or a heterojunction bipolar transistor (HBT) integrated in the structure 602. In some embodiments, the layer above the active quantum well 406 can be a single bulk wafer grown for the purpose of forming the spatially separated porous DBR 408 and 412, and the pHEMT/HBT may be integrated on the single bulk wafer at an available space between the spatially separated DBRs 408 and 412. In this way, the pHEMT/HBT device can be integrated into the layered structure of VCSELs directly, instead of being added as an external device. An example circuit 604 can be formed using the structure 602 with the integrated pHEMT or HBT device. For example, the drain terminal of the HBT is connected with VCSEL 1 and VCSEL 2, via connector 606 as shown in circuit 604.

Figure 7A:
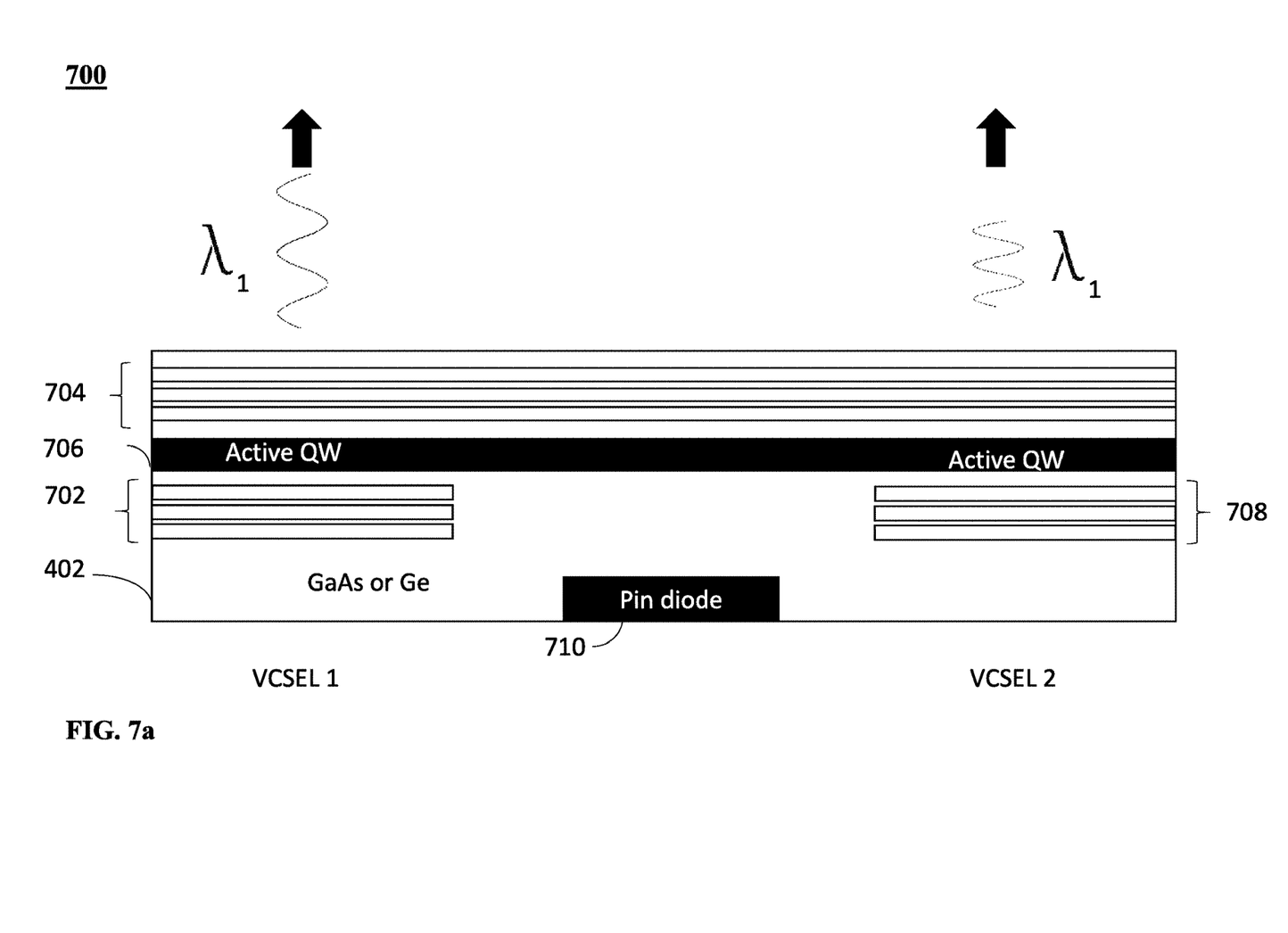
FIG. 7a shows an example diagram illustrating a pin diode integrated in a layered structure including two VCSELs on a single substrate, according to an illustrative embodiment.

FIG. 7a shows an example diagram illustrating a pin diode integrated in a layered structure with two VCSELs formed on the same substrate, according to an illustrative embodiment. Layered structure 700 includes two VCSELs VCSEL 1 and VCSEL 2 formed on the same substrate. Specifically, the two VCSELs are formed with porous multilayers having the same porosities, and thus are configured to operate at the same wavelength. The porosities of VCSEL 1 and VCSEL 2 help in creating a phased array. For example, VCSEL 1 is formed by a first layered structure on substrate 402 including a first porous multilayer 702 having a first porosity over the substrate 402, a first part of an active quantum well capping layer 706 epitaxially grown over the first porous multilayer 702, a first part of an epitaxial DBR 704 grown over the active quantum well capping layer 706. VCSEL 2 is formed by a second porous multilayer 708 having a second porosity over the substrate 402, a second part of the same active quantum well capping layer 706 epitaxially grown over the second porous multilayer 708, a second part of the epitaxial DBR 704 grown over the active quantum well capping layer 706. In the respective example, as the porous multilayers or portions 702 708 and 704 are selected with the same porosity, the formed VCSELs operate at the same wavelength. In some embodiments, the porous multilayers or portions 702 and 708 may have different porosities and the formed VCSELs may operate at different wavelengths.

Additionally, FIG. 7a shows a pin diode 710 integrated in the structure 700. For example, the pin diode 710 is integrated into the substrate 402 at an available space between the spatially separated porous portions 702 and 708. The pin diode 710 can be used for power control of the VCSELs.

Figure 7B:
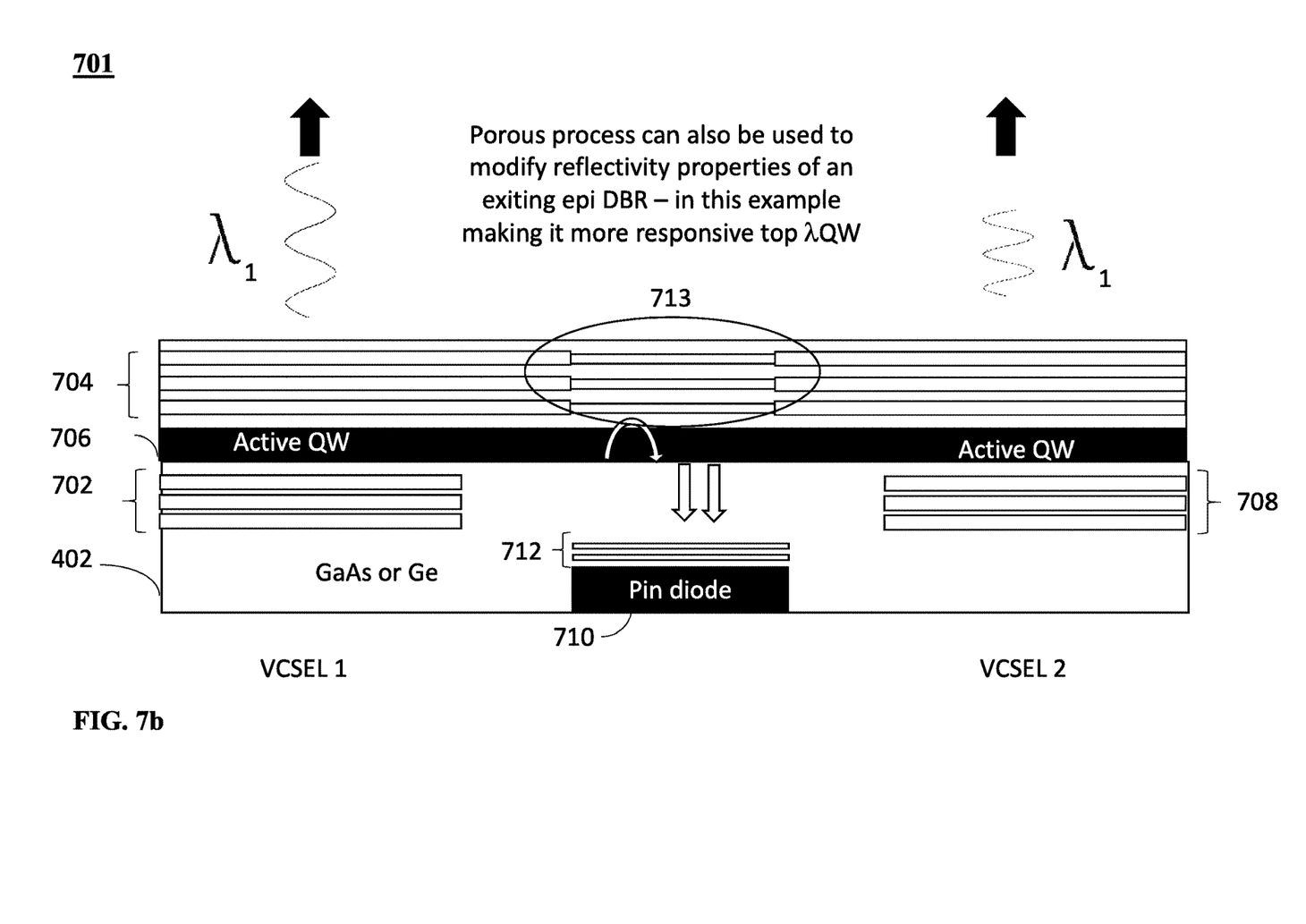
FIG. 7b shows an example diagram illustrating a pin diode integrated in a layered structure including two VCSELs on a single substrate, according to an illustrative embodiment.

FIG. 7b shows an example diagram illustrating a pin diode integrated in a layered structure similar to FIG. 7a but with additional porous structure in the substrate to control light reflectivity of the diode, according to an illustrative embodiment. Layered structure 701 is similar to layered structure 700 with porous DBRs 702 and 708 below the active quantum cap 706, and an epitaxial DBR above the active quantum cap 706. In some embodiments, as the epitaxial DBR 704 over the active quantum well capping layer 706 is continuous, light emitted by active quantum well 706 will reflect from this DBR 704 and then impinge on the diode 710 integrated into the substrate 402. In some embodiments, an additional porous portion 712 may be formed in proximity to the diode 710 to act as a transmission filter for the diode 710, e.g., the porous portion 712 may allow only certain wavelengths to pass through to the diode 710 based on the level of porosity of the porous portion 712. In the respective example shown in FIG. 7a, the porous portion 712 may be configured with a porosity to pass through the same wavelength $\lambda_1$, and thus a device of zero reflectivity at the wavelength $\lambda_1$ can be achieved. In some embodiments, a portion of the epitaxial DBR 704 may be modified using the porous process described above to form a porous portion 713, which can be substantially aligned with the location where the pin diode 710 is integrated such that the porous portion 713 is placed at a position to reflect light waves emitted from the quantum well cap 706 to the pin diode 710. Specifically, porosity of the porous portion 713 may be controlled to yield a reflectivity property to match the reflectivity property of pin diode 710. In this way, the porous portion 713 may be more responsive to light waves at wavelength $\lambda_1$ emitted from the active quantum well 706, and the reflected light waves can then pass through the porous structure 712 to reach the pin diode 710.

As shown in FIGS. 6-7, when spatially-separated DBRs are formed, additional devices, such as a HBT or a diode can be integrated into the substrate of the VCSELs directly, instead of adding the additional devices as an external device to the VCSEL. In this way, circuit area may be more efficiently consumed.

Figure 8A:
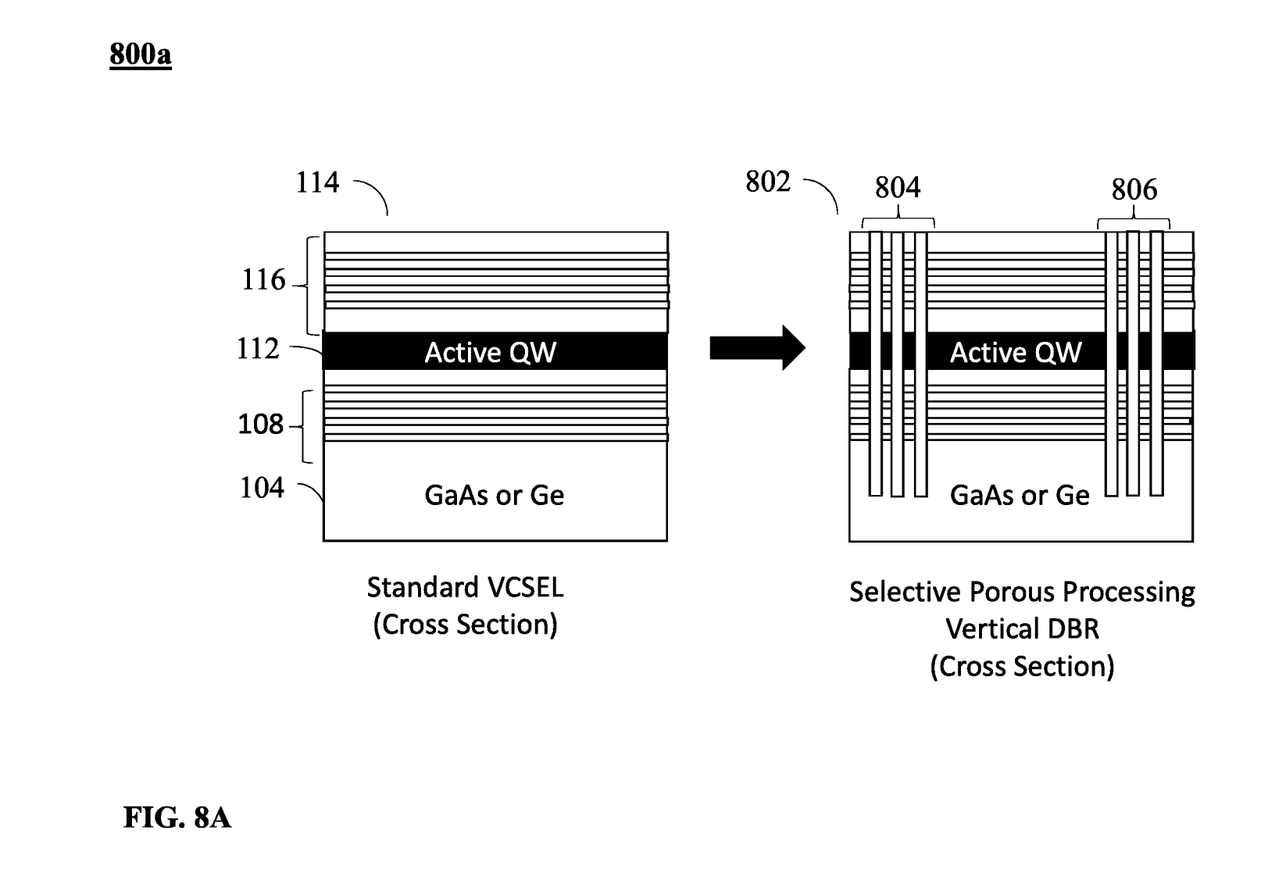
FIG. 8a shows an example diagram illustrates a process to create a vertical DBR over a layered structure with porous multilayer processing for a DBR, according to an illustrative embodiment.

FIG. 8A shows an example diagram illustrates a process to create cross-section DBRs via porous multilayer processing, according to an illustrative embodiment. The process 800a in FIG. 8A begins with the layered structure 114 created via a similar process 100 as illustrated in FIG. 1. The layered structure 114 is a VCSEL comprising a first porous portion 108 over a substrate 104 and a second porous portion 116 over an epitaxial active quantum well layer 112 grown over the first porous portion 108. At 802, a first vertical portion (e.g., vertical epitaxial DBR) 804 and a second vertical portion (e.g., vertical epitaxial DBR) 806 of the VCSEL 114 are formed to cross the porous DBRs 108 and 116. In this way, the original continuous porous DBRs 108 and 116 are interrupted, and sectioned by the vertical DBRs 804 and 806 to form different porous portions of different porosities, respectively. In some embodiments, the vertical porous processing, e.g., the first vertical portion 804 and the second vertical portion 806, is not dependent on the presence of the first porous portion 108 over a substrate 104 and a second porous portion 116 over an epitaxial active quantum well layer 112 grown over the first porous portion 108.

Figure 8B:
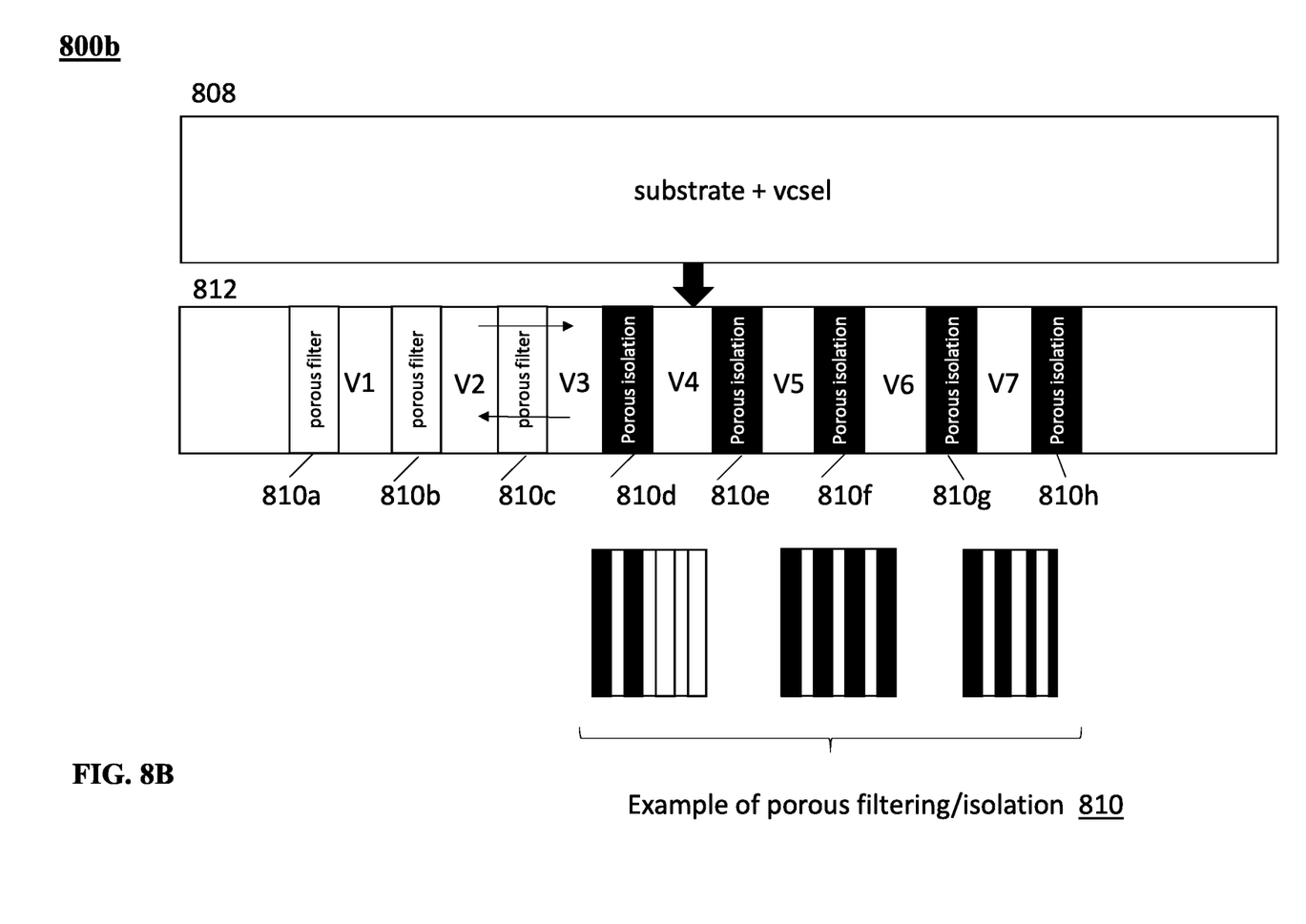
FIG. 8b shows an example diagram illustrates a process to create a vertical DBR over a layered structure with porous multilayer processing for a DBR, according to an illustrative embodiment.

FIG. 8B shows an example diagram illustrates a process to create cross-section DBRs via porous multilayer processing, according to an illustrative embodiment. Process 800b starts at 808 with a substrate and VCSEL 810, e.g., the VCSEL may be similar to those described throughout FIGS. 1-7B. In some embodiments, the substrate 808 may not contain a VCSEL. At 812, various portions of the substrate 810 are modified to form vertical porous portions, e.g., see 810a-h, which separate areas on the substrate 808, so as to produce clearly defined VCSELs V1-V7, respectively. Specifically, as illustrated by the various example widths and distributions of bars at 810, the porosity of the porous portions 810a-h can be chosen to achieve different functions. For example, the porosity of a porous portions can be chosen to block one or more wavelengths so as to isolate VCSELs on different sides of the respective porous region, e.g., see 810d-810h. For another example, the porosities of the vertical porous portions of the substrate 808 may be chosen to form porous filters, e.g., 810a-c. The porous filters may be composed of different thicknesses and different porosities to create different porous filters that may pass through certain wavelengths of light based on composition 808 and combination of the porous filters. In some embodiments, a combination of porous filters (e.g. 810a-c) and porous isolation regions (e.g. 810d-h) may be used together between adjacent VCSELS to allow some level of optical mixing.

Figure 9:
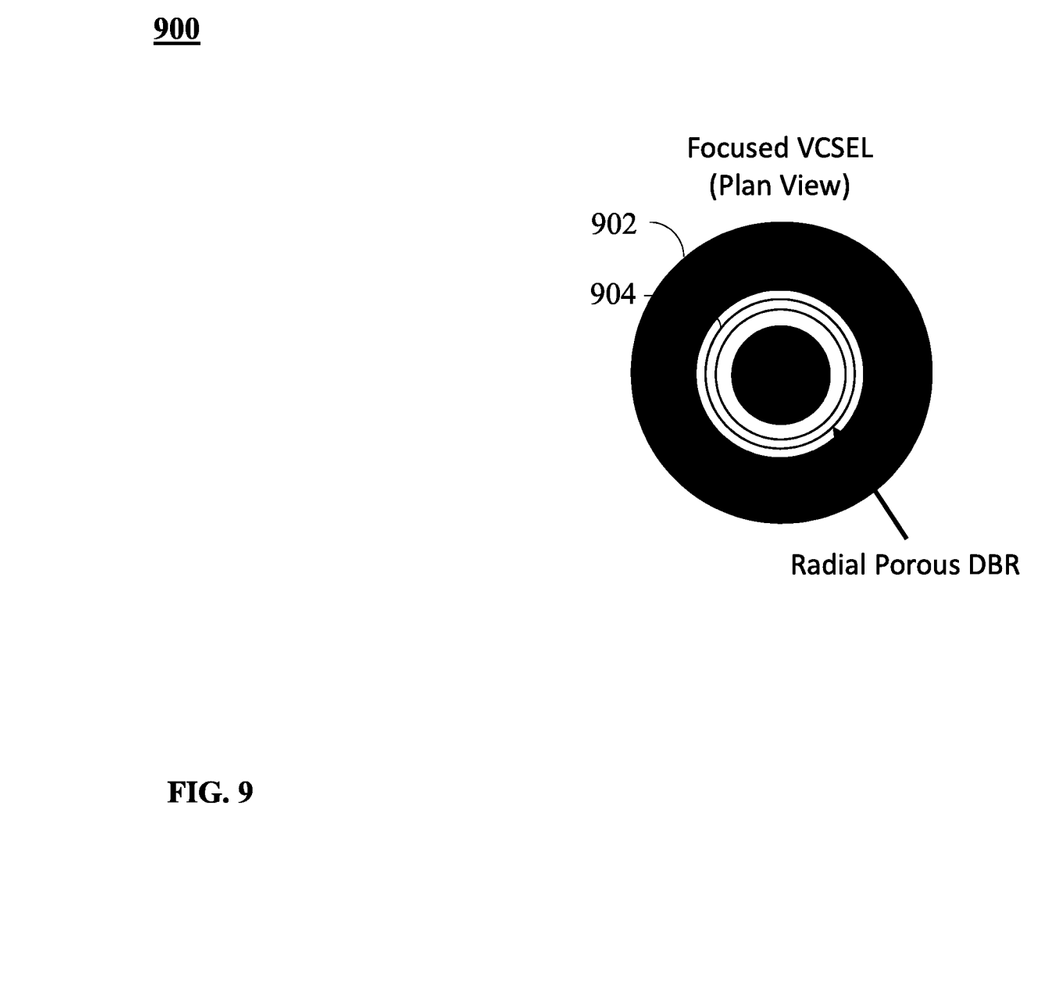
FIG. 9 shows an example diagram illustrating a focused VCSEL including a radial porous DBR, according to an illustrative embodiment.

FIG. 9 shows an example diagram illustrating a focused VCSEL including a radial porous DBR, according to an illustrative embodiment. Circular structure 900 depicts a circular substrate 902. The circular structure 900 includes a radial porous DBR 904, a radial quantum well cap, and additional radial DBRs (e.g., porous or epitaxial, or a combination of both as described in FIGS. 2-3 but in a radial form) within the circular substrate 902 to form a focused VCSEL.

It is worth noting that the porous DBRs shown in FIGS. 1-9 may include a porous layer of the same thickness and porosity. In some embodiments, it is possible that both the thickness and the porosity of the porous layer may be varied through a DBR region thereby creating more complex reflectivity spectra.

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HYPE), pulsed laser deposition (PLD), and/or physical vapor deposition (PVD).

As described herein, a layer means a substantially-uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire. A substrate may have a single bulk wafer, or multiple sub-layers. Specifically, a substrate may include multiple non-continuous porous portions. The multiple non-continuous porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor refers to any solid substance that has a conductivity between that of an insulator and that of most metals. An example semiconductor layer is composed of silicon. The semiconductor layer may include a single bulk wafer, or multiple sub-layers. Specifically, a silicon semiconductor layer may include multiple non-continuous porous portions. The multiple non-continuous porous portions may have different densities and may be horizontally distributed or vertically layered.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions between prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

A first layer described and/or depicted herein as "configured on," "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A structure, comprising:
a substrate including a first porous region having a first porosity formed therein;
an active quantum well region epitaxially grown over the first porous region;
a second porous region having the first porosity over the active quantum well region,
wherein edges of the second porous region align with edges of the first porous region, and
wherein the substrate is a single base material.

2. The structure of claim 1, wherein the substrate is composed of germanium or gallium arsenide.

3. The structure of claim 1, wherein
a stack of the first porous region, at least a first part of the active quantum well region that aligns with the first porous region, and the second porous region allows a first light wave at a first wavelength to pass through the stack.

4. The structure of claim 1, further comprising:
a first epitaxial distributed Bragg reflector multilayer grown over the substrate between the first porous region and the active quantum well region,
wherein the second porous region includes a second epitaxial distributed Bragg reflector multilayer over the active quantum well region, and
wherein a first reflectivity of the first epitaxial distributed Bragg reflector multilayer is different from a second reflectivity of the second epitaxial distributed Bragg reflector multilayer, thereby causing a stack of the first porous region, the first epitaxial distributed Bragg reflector multilayer, and the second epitaxial distributed Bragg reflector multilayer to allow a first light wave at a first wavelength to pass through the stack.

5. The structure of claim 1, wherein the first porous region and the second porous region align with a first region on the active quantum well region, and the substrate includes a third porous region formed therein, and
wherein the structure further comprises:
a fourth porous region having a second porosity over the active quantum well region,
wherein the second porous region and the fourth porous region are porous portions of a bulk layer grown over the active quantum well region, and
wherein the third porous region and the fourth porous region align with a second region on the active quantum well region.

6. The structure of claim 5, wherein:
the first porous region and the third porous region have different dimensions or different porosities, and the second porous region and the fourth porous region have different dimensions or different porosities.

7. The structure of claim 5, wherein:
the first porous region, at least the first region of the active quantum well region, and the second porous region form a first VCSEL that allows a first light wave at a first wavelength to pass through, and
the third porous region, at least the second region of the active quantum well region and the fourth porous region form a second VCSEL that allows a second light wave at a second wavelength to pass through.

8. The structure of claim 5, further comprising:
a pseudomorphic high-electron-mobility transistor or a heterojunction bipolar transistor integrated into a bulk wafer at a space between the second porous region and the fourth porous region.

9. The structure of claim 5, wherein the second porous region and the fourth porous region have the first porosity and are connected to each other as a continuous porous multilayer in a bulk wafer.

10. The structure of claim 1, wherein the second porous region is a porous portion of a bulk layer grown over the active quantum well region, and
wherein the bulk layer has a plurality of spatially distributed porous multilayers, each porous multilayer from the plurality of spatially distributed porous multilayers having a porosity selected to yield a specific reflectivity of each porous multilayer to allow a light wave at a specific wavelength to pass through.

11. The structure of claim 1, further comprising:
one or more vertical porous portions perpendicular to and across the first porous region, the active quantum well region and the second porous region,
wherein the one or more vertical porous portions divides a stack of the first porous region, the active quantum well region, and the second porous region to form multiple VCSELs.

12. The structure of claim 11, wherein a thickness and a porosity of at least one vertical porous portion is selected to form a porous filter that allows a third light wave at a third wavelength to pass between two adjacent VCSELs from the multiple VCSELs.

13. The structure of claim 11, wherein a thickness and a porosity of at least one vertical porous portion is selected to form a porous isolation that allows no light wave passage between two adjacent VCSELs from the multiple VCSELs.

14. The structure of claim 1, wherein:
the first porous region comprises a first porous multilayer comprising alternating porous and substantially non-porous layers, and
the second porous region comprises a second porous multilayer comprising alternating porous and substantially non-porous layers.

15. A structure, comprising:
a substrate comprising:
a first porous region having a first porosity formed therein; and
a second porous region having a second porosity formed therein and spaced apart from the first porous region;
an active quantum well region epitaxially grown over the first and second porous regions;
a third porous region having the first porosity above the first porous region and over the active quantum well region; and a fourth porous region having the second porosity above the second porous region, over the active quantum well region, and spaced apart from the third porous region, wherein the substrate is a single base material.

16. The structure of claim 15, wherein the active quantum well region extends laterally between the first and second porous regions.

17. The structure of claim 15, wherein:

the first porous region comprises a first porous multilayer comprising alternating porous and substantially non-porous layers, the second porous region comprises a second porous multilayer comprising alternating porous and substantially non-porous layers, the third porous region comprises a third porous multilayer comprising alternating porous and substantially non-porous layers, and the fourth porous region comprises a fourth porous multilayer comprising alternating porous and substantially non-porous layers.

18. A method comprising:

forming a first porous region having a first porosity within a substrate;

epitaxially growing an active quantum well region over the first porous region; and forming a second porous region having the first porosity over the active quantum well region, wherein the substrate is a single base material.

19. The method of claim 18, wherein forming the first porous region comprises etching a region of the substrate with an acid current.

20. The method of claim 19, wherein forming the first porous region comprises controlling one or more of a concentration of the acid current and a fluid velocity of the acid current.

21. The method of claim 18, wherein:

the first porous region comprises a first porous multilayer comprising alternating porous and substantially non-porous layers, and the second porous region comprises a second porous multilayer comprising alternating porous and substantially non-porous layers.

* * * * *